(12) United States Patent
Ohsawa

(10) Patent No.: US 6,980,474 B2
(45) Date of Patent: Dec. 27, 2005

(54) SEMICONDUCTOR MEMORY DEVICE

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 10/882,354

(22) Filed: Jul. 2, 2004

(65) Prior Publication Data

US 2005/0259489 A1 Nov. 24, 2005

(30) Foreign Application Priority Data

May 20, 2004 (JP) ............................. 2004-150492

(51) Int. Cl.[7] ............................. G11C 7/00; G11C 7/02
(52) U.S. Cl. .......................... 365/189.01; 365/189.04; 365/207
(58) Field of Search .................. 365/189.01, 189.04, 365/189.05, 205, 207, 208, 230.06, 230.08

(56) References Cited

U.S. PATENT DOCUMENTS

| 6,104,664 | A | * | 8/2000 | Ohno ..................... 365/230.06 |
| 6,400,640 | B2 | * | 6/2002 | Woo et al. ............. 365/230.06 |
| 6,538,916 | B2 | | 3/2003 | Ohsawa |
| 6,621,725 | B2 | | 9/2003 | Ohsawa |
| 6,850,449 | B2 | * | 2/2005 | Takahashi ................... 365/205 |

FOREIGN PATENT DOCUMENTS

| JP | 2002-246571 | 8/2002 |
| JP | 2003-68877 | 3/2003 |

OTHER PUBLICATIONS

Takashi Ohsawa, et al., "Memory Design Using One-Transistor Gain Cell on SOI", 2002 IEEE International Solid-State Circuits Conference, 2002, pp. 152-153, and 454.
U.S. Appl. No. 10/882,354, filed Jul. 2, 2004, Ohsawa.
U.S. Appl. No. 10/891,000, filed Jul. 15, 2004, Ohsawa.
U.S. Appl. No. 10/901,237, filed Jul. 29, 2004, Ohsawa.

* cited by examiner

Primary Examiner—Trong Phan
(74) Attorney, Agent, or Firm—Oblon, Spivak, McClelland, Maier & Neustadt, P.C.

(57) ABSTRACT

A semiconductor memory device disclosed herein has a memory cell array in which memory cells are arranged in a matrix form, data being written into each of the memory cells by passing a cell current therethrough; word lines which are provided in parallel along a row direction in the memory cell array; bit lines which are provided in parallel along a column direction in the memory cell array, the column direction being crossed with the row direction; sense amplifiers which are respectively connected to the bit lines and which write data held in the sense amplifiers into the memory cells; a data line which supplies data to be written into the sense amplifiers; and a control circuit which, in a continuous write operation of performing write operations by continuously switching a column address to select a column, opens only a connection between the sense amplifier selected by the column address and the bit line to write the data held in the sense amplifier into the memory cell.

14 Claims, 11 Drawing Sheets

OPERATION WAVEFORMS IN REFRESH OPERATION

FIG. 5 OPERATION WAVEFORMS IN CONTINUOUS WRITE OPERATION

FIG. 6 OPERATION WAVEFORMS IN CONTINUOUS READ OPERATION

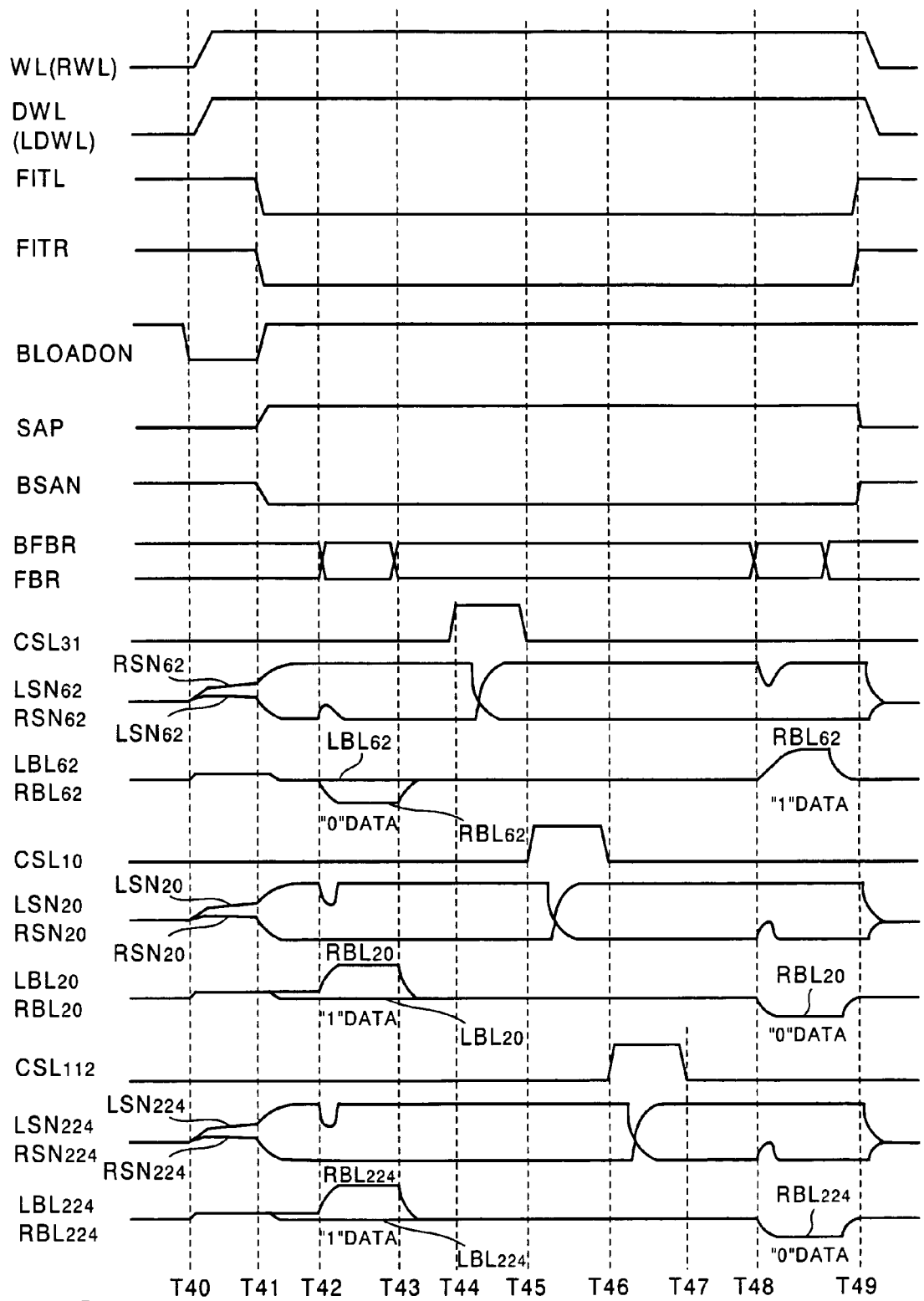
FIG.11 OPERATION WAVEFORMS IN CONTINUOUS WRITE OPERATION

SEMICONDUCTOR MEMORY DEVICE

CROSS REFERENCE TO RELATED APPLICATION

This application claims benefit of priority under 35 U.S.C. §119 to Japanese Patent Application No. 2004-150492, filed on May 20, 2004, the entire contents of which are incorporated by reference herein.

BACKGROUND OF THE INVENTION

1. Field of the Invention

The present invention relates to a semiconductor memory device, and particularly relates to a semiconductor device including an FBC (Floating Body Cell) which stores information by accumulating majority carriers in a body in a floating state in a field effect transistor (FET).

2. Background Art

The fabrication of a related DRAM cell having one transistor and one capacitor which includes a trench capacitor or a stacked capacitor is getting difficult with its miniaturization. However, as an alternative memory cell thereto, a new memory cell FBC which stores information by accumulating majority carriers in a body in a floating state in an FET (Field Effect Transistor) formed on a Silicon on Insulator (SOI) or the like (See Document 1: Japanese Patent Application Laid-open No. 2003-68877, and Document 2: Japanese Patent Application Laid-open No. 2002-246571, for example) was proposed.

An element unit of this memory cell to store one bit of information has only one MISFET (Metal Insulator Semiconductor Field Effect Transistor), whereby the area occupied by one bit is small, so that a mass storage element can be formed on a limited silicon area. Accordingly, it is thought that this can contribute to an increase in storage capacity.

The reading of data from such a MISFET is performed by current read (See Document 3: 2002 IEEE International Solid-State Circuits Conference, "Memory Design Using One-Transistor Gain Cell on SOI", p152, p153, p454). Namely, a word line connected to a gate of the MISFET is set, for example, to 1.5 V, a bit line connected to a drain is set, for example, to as low as 0.2 V, the transistor is operated in a linear region, and "1" data and "0" data are distinguished by detecting current difference using an effect (body effect) in which a threshold voltage Vth of the transistor differs according to the number of holes accumulated in the body. Incidentally, the reason the voltage of the bit line is set to as low as 0.2 V in a read operation in this example is that if the voltage of the bit line is set high and biased to a saturation state, there is a possibility that when the "0" data is read, the "0" data cannot be correctly detected because the data is changed into the "1" data by impact ionization.

In a related semiconductor memory device using FBCs, one sense amplifier is provided for plural bit lines, and when the sense amplifier is connected to a bit line, one bit line is selected from the plural bit lines and connected. This makes it possible to realize a reduction in the number of sense amplifiers and a reduction in chip area. The reason which makes this configuration possible is based on the premise that the FBC is capable of non-destructive read-out. In other words, this is because the FBC is thought to have a characteristic that data in a memory cell from which the data is not read is not destroyed even when a word line rises, and if the word line returns to a holding level, the data remains held as it was before.

However, in the later FBC characteristic evaluation, it has turned out that the FBC is not completely a non-destructive read-out cell. This is because it has proved that a charge pumping phenomenon exerts an influence on the characteristic of the memory cell. This charge pumping phenomenon is a phenomenon in which holes gradually disappear at an interface between a silicon surface and a gate insulating film (for example, $SiO_2$) when operations of bringing the silicon surface into an inversion state and an accumulation state are alternately repeated by pumping the gate of the transistor a plurality of times.

The number of holes which disappear by one change of state of inversion/accumulation depends on an interface state density Nit of the Si—$SiO_2$ interface. If Nit=$1 \times 10^{10}$ cm$^{-2}$ is assumed, the area of the Si—$SiO_2$ interface is $1.0 \times 10^{-10}$ cm$^2$ per cell when the cell transistor has W/L=0.1 μm/0.1 μm, whereby the number of holes which disappear by one change of state is approximately one on average per cell. The difference in the number of holes between "1" data and "0" data in one FBC is approximately 1000. This means that after approximately 1000-time pumping of the word line, the "1" data completely changes to the "0" data. Actually, the read margin of the "1" data disappears after approximately 500-time pumping, and the risk of causing failures increases. Accordingly, it turns out that the FBC is neither a destructive read-out cell nor a complete non-destructive read-out cell. It turns out that it is, so to speak, a quasi non-destructive read-out cell.

If a sense amplifier of a related system is used in the aforementioned case, since data is not written back even if a word line rises, a failure in which the "1" data has changed to the "0" data is caused if the word line rises approximately 500 times before a refresh operation is performed. Therefore, apart from whether the memory cell is selected for read/write, the design of a sense amplifier which takes some measures against the charge pumping phenomenon is needed for all of the memory cells holding the "1" data whose word lines are activated.

Moreover, there is a problem that the related system sense amplifier is inefficient in the refresh operation. Namely, there is a problem that the number of memory cells which can be refreshed in one refresh cycle is smaller as compared with the conventional DRAM. For example, in a sense amplifier disclosed in Document 3, the refresh efficiency reduces to ⅛. Accordingly, when the refresh time is the same, it is necessary to set the refresh cycle eight times as frequently as the conventional DRAM, and correspondingly the proportion in which the normal operation cannot be performed increases.

Furthermore, in the configuration of the semiconductor memory device in Document 3, there is a problem that the number of memory cells which can be accessed in a high-speed column access is limited. In other words, when a mode in which data in memory cells are read by raising a word line, latched in a sense amplifier, and continuously accessed at high speed by switching the column address to thereby increase data transfer rate (this mode is also called the Fast Page Mode) is used, the number of accessible data reduces to ⅛ as compared with the normal DRAM.

On the other hand, when sense amplifiers are provided independently corresponding to respective bit lines, the cell current flows from each sense amplifier to a source of a memory cell in a write operation, which causes a problem that current consumption increases. Namely, in a write cycle, a connection between each sense amplifier and each bit line is opened irrespective of whether each memory cell is a memory cell into which data is actually written, and therefore the cell current flows from each sense amplifier to each memory cell. Besides, the cell current continues flowing until one write cycle is completed.

SUMMARY OF THE INVENTION

In order to accomplish the aforementioned and other objects, according to one aspect of the present invention, a semiconductor memory device, comprises:

a memory cell array in which memory cells are arranged in a matrix form, data being written into each of the memory cells by passing a cell current therethrough;

word lines which are provided in parallel along a row direction in the memory cell array;

bit lines which are provided in parallel along a column direction in the memory cell array, the column direction being crossed with the row direction;

sense amplifiers which are respectively connected to the bit lines and which write data held in the sense amplifiers into the memory cells;

a data line which supplies data to be written into the sense amplifiers; and a control circuit which, in a continuous write operation of performing write operations by continuously switching a column address to select a column, opens only a connection between the sense amplifier selected by the column address and the bit line to write the data held in the sense amplifier into the memory cell.

According to another aspect of the present invention, a semiconductor memory device, comprises:

a memory cell array in which memory cells are arranged in a matrix form, data being written into each of the memory cells by passing a cell current therethrough;

word lines which are provided in parallel along a row direction in the memory cell array;

bit lines which are provided in parallel along a column direction in the memory cell array, the column direction being crossed with the row direction;

sense amplifiers which are respectively connected to the bit lines and which write data held in the sense amplifiers into the memory cells;

a data line which supplies data to be written to the sense amplifiers; and a control circuit which, in a continuous write operation of performing write operations by continuously switching a column address to select a column, after cutting off connections between the sense amplifiers and the bit lines and continuously switching the column address such that each of the sense amplifiers holds the data to be written, opens the connections between the sense amplifiers and the bit lines and writes the data held in the sense amplifiers into the memory cells at once.

BRIEF DESCRIPTION OF THE DRAWINGS

FIG. 11 is a timing chart explaining a continuous write operation of a semiconductor memory device according to the second embodiment.

DETAILED DESCRIPTION OF THE EMBODIMENTS

First Embodiment

In a semiconductor memory device according to this embodiment, all bit lines are connected to sense amplifiers, paths to write back data held in the sense amplifiers into memory cells are controlled not only in a row direction but also in a column direction. Further details will be given below.

First, a write and a read principle of an FBC according to this embodiment will be explained. The FBC according to this embodiment has an N-type MISFET formed on a PD (partially Depleted)-SOI. Hereinafter, a state where there are many holes in a body of the MISFET is defined as "1" data, whereas a state where there are very few holes therein is defined as "0" data.

Figure 1:
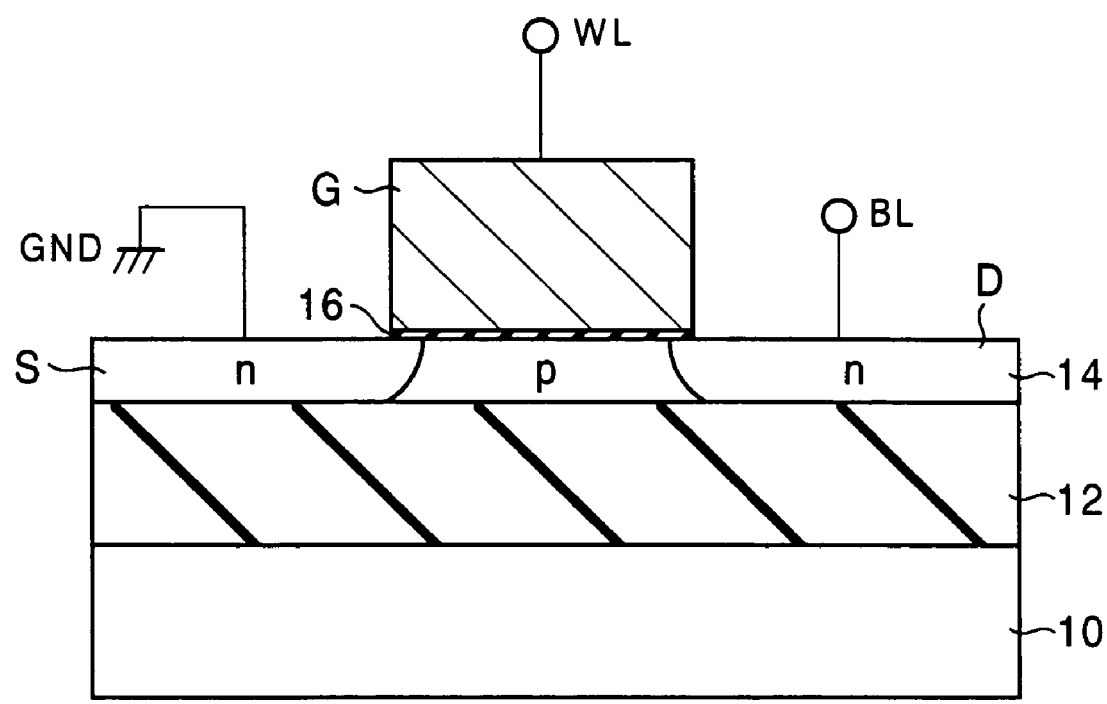
FIG. 1 is a diagram explaining the structure of an FBC according to a first embodiment.

FIG. 1 shows an FBC transistor. An SOI substrate includes a silicon substrate 10 and an insulating film 12. The FBC includes an N-type MISFET formed on this SOI substrate. More specifically, a semiconductor layer 14 is formed on the SOI substrate, and a source S and a drain D are formed in this semiconductor layer 14. The semiconductor layer 14 between the source S and the drain D constitutes the aforementioned body. A gate G is formed on the semiconductor layer 14 with a gate insulating film 16 therebetween. Here, the source S is a ground GND (0 V), the drain D is connected to a bit line BL, and the gate G constitutes a word line WL. The body is electrically floating.

To write the "1" data, the transistor is operated in a saturation state. For example, the word line WL and the bit line BL are biased to 1.5 V and 1.5 V, respectively. In such a state, many electron-hole pairs are created in the neighborhood of the drain D due to impact ionization. Out of these electron-hole pairs, electrons are drawn into a drain terminal, whereas holes are accumulated in the body with a low potential. The body voltage reaches an equilibrium state when a current generated by the holes due to the impact ionization and a forward current in a pn junction between the body and the source S are balanced. The body voltage is approximately 0.7 V.

On the other hand, to write the "0" data, the voltage of the bit line BL is lowered to a negative voltage. For example, it is lowered to −1.5 V. A p-region of the body and an n-region connected to the bit line BL are strongly forward biased by this operation, and hence most of the holes accumulated in the body are emitted to the n-region. Consequently, the number of holes reduces, and the state of the "0" data can be obtained.

Figure 2:
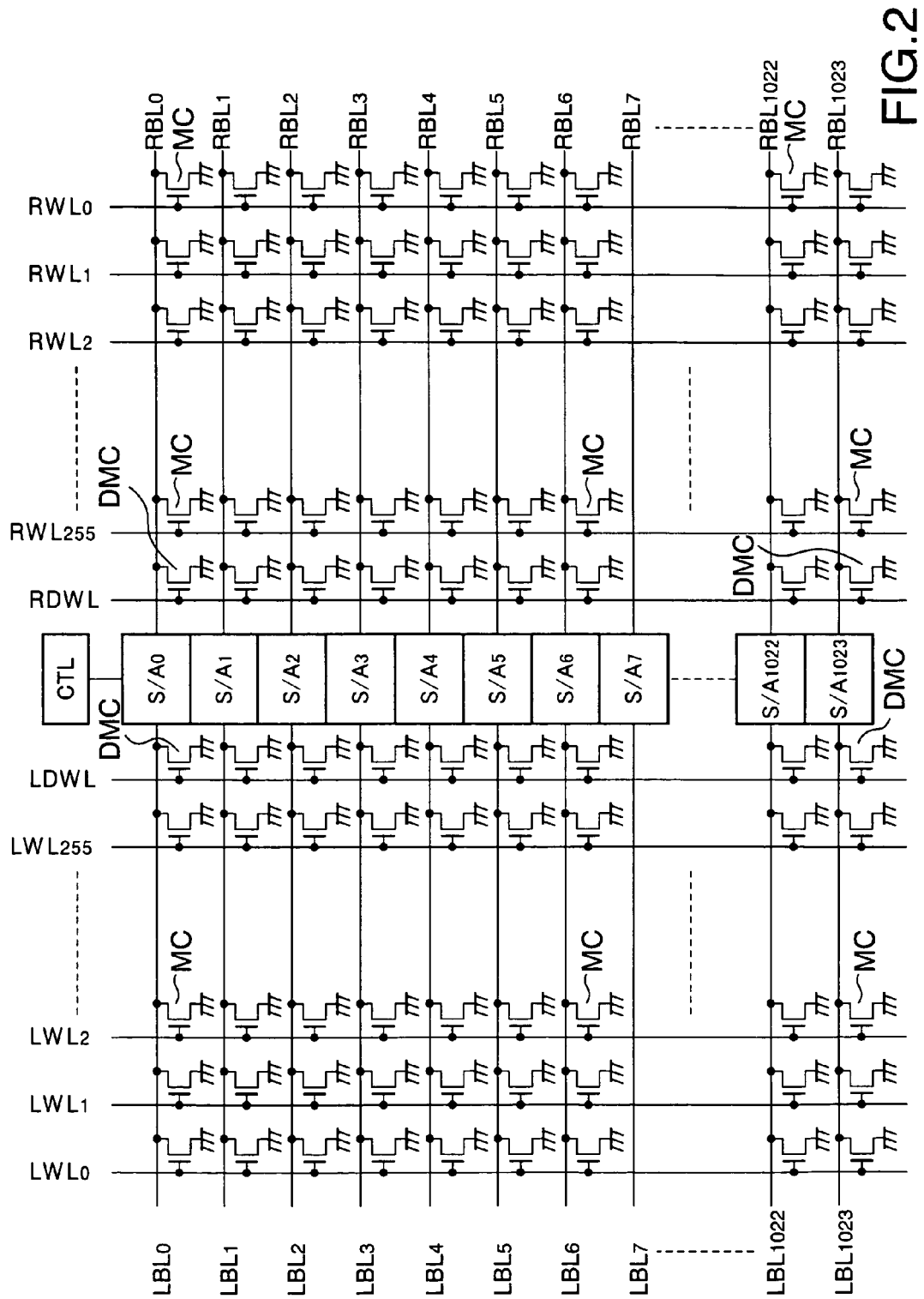
FIG. 2 is a diagram explaining the layout of a memory cell array in a semiconductor memory device according to the first embodiment.

FIG. 2 is a diagram showing part of the configuration of a memory cell array of the semiconductor memory device according to this embodiment. As shown in FIG. 2, the memory cell array according to this embodiment is formed in an open bit line configuration.

More specifically, on the right side of sense amplifiers $S/A_0$ to $S/A_{1023}$, 256 word lines $RWL_0$ to $RWL_{255}$ are provided in parallel along a row direction, and on the left side thereof, 256 word lines $LWL_0$ to $LWL_{255}$ are provided in parallel along the row direction. Moreover, to the right side of the sense amplifiers $S/A_0$ to $S/A_{1023}$, 1024 bit lines $RBL_0$ to $RBL_{1023}$ which are provided in parallel along a column direction are connected, and to the left side thereof, 1024 bit lines $LBL_0$ to $LBL_{1023}$ which are provided in parallel along the column direction are connected. Namely, one sense amplifier S/A is provided for a pair of right and left bit lines RBL and LBL. Memory cells MC each having an FBC are respectively provided at intersection points of the word lines $RWL_0$ to $RWL_{255}$ and the bit lines $RBL_0$ to $RBL_{1023}$ and at intersection points of the word lines $LWL_0$ to $LWL_{255}$ and the bit lines $LBL_0$ to $LBL_{1023}$. The structure of the memory cell MC is the same as that in FIG. 1.

On the right side of the sense amplifiers $S/A_0$ to $S/A_{1023}$, a dummy word line RDWL is provided in parallel with the word lines $RWL_0$ to $RWL_{255}$, and on the left side of the sense amplifiers $S/A_0$ to $S/A_{1023}$, a dummy word line LDWL is provided in parallel with the word lines $LWL_0$ to $LWL_{255}$. Dummy cells DMC having the same structure as the memory cell MC are respectively provided at intersection points of the dummy word line RDWL and the bit lines $RBL_0$ to $RBL_{1023}$ and at intersection points of the dummy word line LDWL and the bit lines $LBL_0$ to $LBL_{1023}$.

Moreover, the semiconductor memory device according to this embodiment is provided with a control circuit CTL, and this control circuit CTL generates and supplies signals and voltages required for the operation of this semiconductor memory device when necessary.

A basic read operation of the memory cell array thus configured can be performed in the following manner. First, out of left and right cell arrays of this memory cell array, the cell array from which data is read is selected, one word line WL (RWL or LWL) included in the selected cell array rises, and at the same time, the dummy word line DWL (LDWL or RDWL) included in the cell array on the opposite side rises. Intermediate level (½ level) data between the "0" data and the "1" data is held in each of the dummy cells DMC connected to the dummy word line DWL. However, it is also possible to write the "0" data and the "1" data alternately into the dummy cells DMC and average each of these pairs by a circuit not shown at the time of the read operation to create a state where the ½ level data is written. Further, it is also possible to average every plural pairs or all the pairs to create the state where the ½ level data is written.

Then, in this embodiment, by comparing a cell current flowing through the memory cell MC from which data is to be read and a reference current flowing through the ½ level dummy cell DMC and judging which of the cell current and the reference current is larger, it can be judged whether the data held in the memory cell MC is the "0" data or the "1" data.

Figure 3:
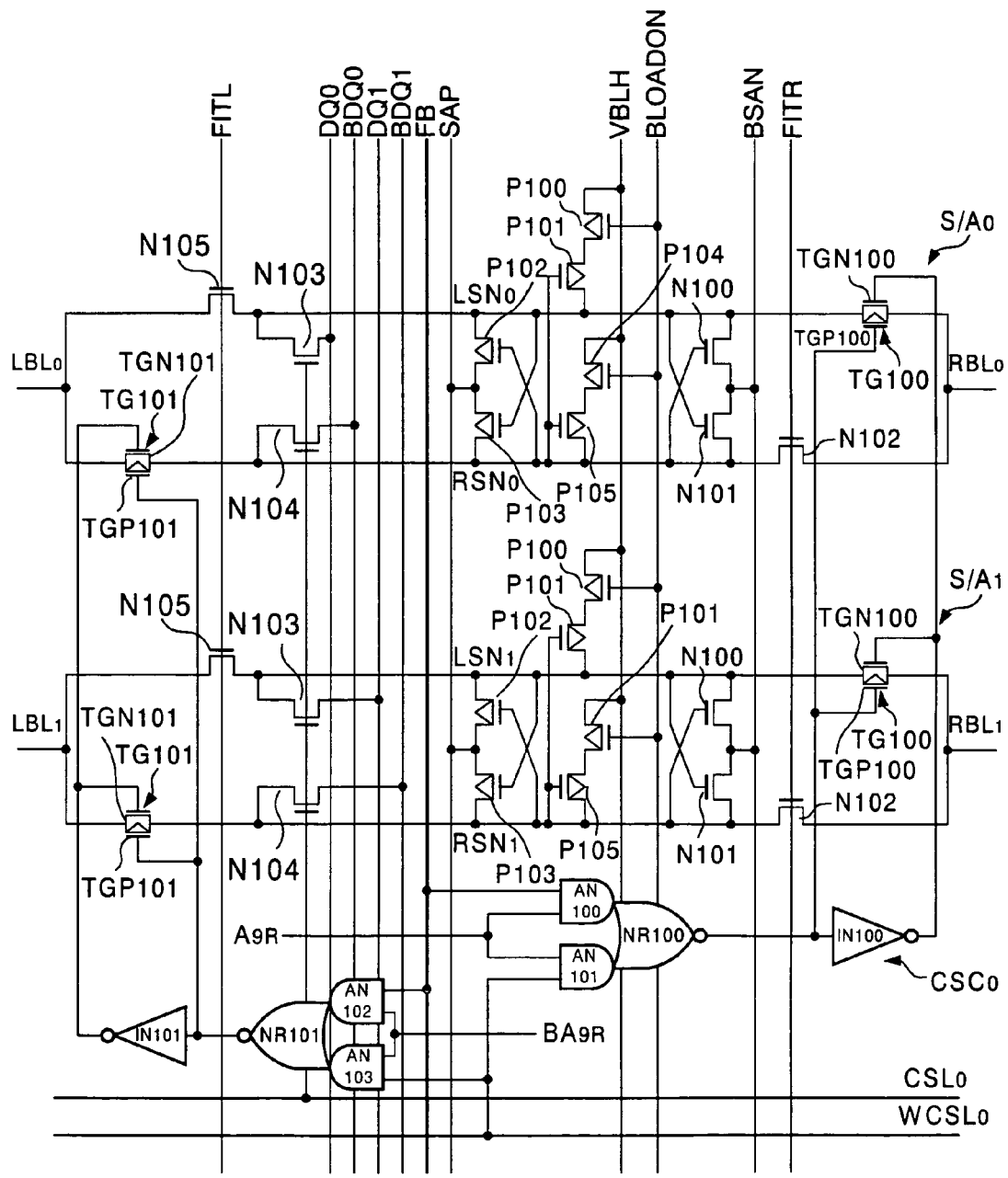
FIG. 3 is a diagram showing the configurations of a sense amplifier and a column selection circuit according to the first embodiment.

FIG. 3 is a diagram showing an example of the circuit configuration of a sense amplifier S/A and a column selection circuit CSC. In FIG. 3, two sense amplifiers $S/A_0$ and $S/A_1$ and their corresponding one column selection circuit $CSC_0$ are shown, and the other sense amplifiers S/A also have the same configuration. Namely, in this embodiment, one column selection circuit CSC is provided for two sense amplifiers S/A.

The sense amplifiers $S/A_0$ and $S/A_1$ each include transfer gates TG100 and TG101, N-type FETs N100 to N105, and P-type FETs P100 to P105. The transfer gate TG100 includes an N-type FET TGN100 and a P-type FET TGP100. The transfer gate TG101 includes an N-type FET TGN101 and a P-type TGP101.

Moreover, as wiring, a signal line FITL, a data line DQ0, a data line BDQ0, a data line DQ1, a data line BDQ1, a signal line FB, a voltage supply line SAP, a voltage supply line VBLH, a signal line BLOADON, a voltage supply line BSAN, a signal line FITR, a signal line $CSL_0$, and a signal line $WCSL_0$ are provided. A positive voltage (1.5 V, for example) is constantly applied to the voltage supply line VBLH. 0 V or a negative voltage (−1.5 V, for example) is selectively applied to the voltage supply line BSAN, and 0 V or a positive voltage (1.5 V, for example) is selectively applied to the voltage supply line SAP.

The column selection circuit $CSC_0$ includes inverter circuits IN100 and IN101, AND circuits AN100 to AN103, and NOR circuits NR100 and NR101. A signal $A_{9R}$ and a signal $BA_{9R}$ are inputted to the column selection circuit $CSC_0$. In this embodiment, one signal line CSL and one signal line WCSL are provided for one column selection circuit CSC.

A signal of the signal line FITL, data of the data line DQ0, data of the data line BDQ0, data of the data line DQ1, data of the data line BDQ1, a signal of the signal line FB, a voltage of the voltage supply line SAP, a voltage of the voltage supply line VBLH, a signal of the signal line BLOADON, a voltage of the voltage supply line BSAN, a signal of the signal line FITR, the signal $A_{9R}$, and the signal $BA_{9R}$ are supplied from the control circuit CTL. A signal of the signal line $CSL_0$ and a signal of the signal line $WCSL_0$ are supplied from the column decoder circuit not shown here.

Incidentally, the transfer gates TG100 and TG101 constitute a first switch circuit which turns on/off the connection between the sense amplifier S/A and the bit lines RBL and LBL, and FETs N103 and N104 constitute a second switch circuit which turns on/off the connection between the sense amplifier S/A and the data lines DQ0, BDQ0, DQ1, and BDQ1. Moreover, the signal line $CSL_0$ constitutes a first control signal line, the signal line FB constitutes a second control signal line, and the signal line $WCSL_0$ constitutes a third control signal line.

Figure 4:
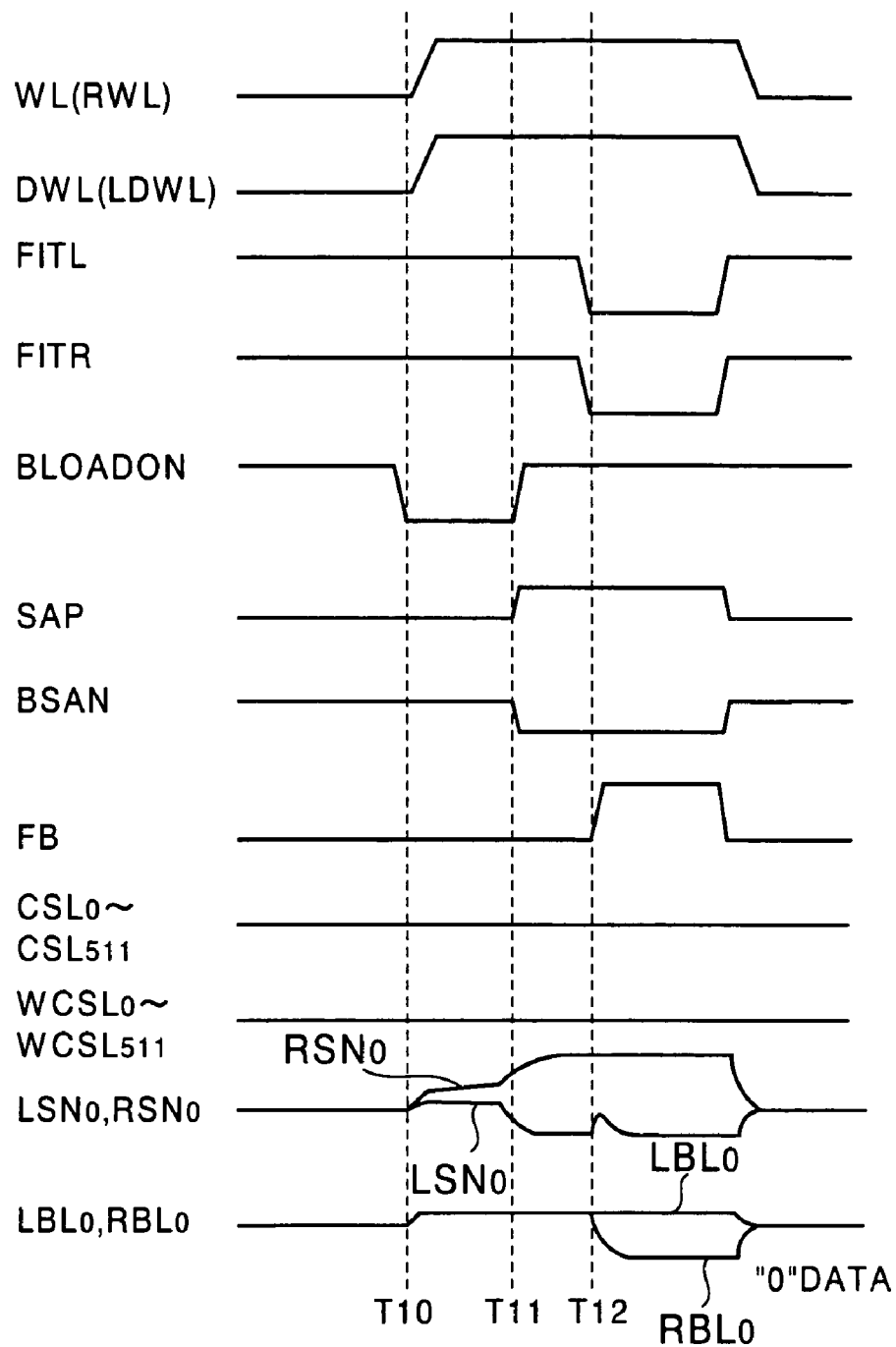
FIG. 4 is a timing chart explaining a refresh operation of the semiconductor memory device according to the first embodiment.

FIG. 4 is a diagram showing operation waveforms in a refresh operation. At a point in time T10, one word line WL rises, and at the same time, the dummy word line DWL in the cell array on the opposite side rises. FIG. 4 shows a case where one word line RWL on the right side of the sense amplifiers $S/A_0$ to $S/A_{1023}$ rises, and one dummy word line LDWL on the left side of the sense amplifiers $S/A_0$ to $S/A_{1023}$ rises as an example. In short, a case where the memory cells MC in the right cell array in the drawing are refreshed is assumed here.

At this point in time T10, the signal line BLOADON goes low, whereby the FETs P100 and P104 are turned on. Since the signal lines FITL and FITR are high, the FETs N102 and N105 are on. Since the bit lines $RBL_0$ to $RBL_{1023}$ are low, the FETs P101 and P105 are on. Therefore, a current flows from the voltage supply line VBLH to which the positive voltage is supplied to the bit lines $LBL_0$ to $LBL_{1023}$ and $RBL_0$ to $RBL_{1023}$.

Accordingly, a current (cell current) which corresponds to data held in each of the memory cells MC, from which the data is to be read, flows to the bit lines $RBL_0$ to $RBL_{1023}$ in the right cell array which is to be refreshed, and a ½ level current (reference current) held in the dummy cells DMC flows to the bit lines $LBL_0$ to $LBL_{1023}$ in the left cell array which is not to be refreshed. Consequently, nodes $RSN_0$ to $RNS_{1023}$ connected to the memory cells MC each come to have a voltage corresponding to the "0" data or the "1" data held in each of the memory cells MC, and nodes $LSN_0$ to $LSN_{1023}$ connected to the dummy cells DMC come to have an intermediate voltage between the "0" data and the "1" data.

Then, at a point in time T11, the signal line BLOADON goes high, whereby the FETs P100 and P104 are turned off. Therefore, the supply of the voltage from the voltage supply line VBLH is stopped. Simultaneously with this, the voltage supply line SAP goes high, and the voltage supply line BSAN goes low. As a result, as concerns the nodes $LSN_0$ to $LSN_{1023}$ and $RSN_0$ to $RSN_{1023}$, the node with the upper voltage comes to have the positive voltage (1.5 V, for example) and the node with the lower voltage comes to have the negative voltage (–1.5 V. for example), respectively.

For example, when the "0" data is held in the memory cell MC connected to $RBL_0$, the threshold value of the memory cell MC becomes high, whereby the voltage of the node $RSN_0$ becomes higher than the voltage of the node $LSN_0$. Accordingly, the FET P103 is turned on and the FET P102 is turned off. Hence, the positive voltage (1.5 V, for example) of the voltage supply line SAP is transmitted to the node $RSN_0$. On the other hand, the FET N100 is turned on and the FET N101 is turned off. Hence, the negative voltage (–1.5 V, for example) of the voltage supply line BSAN is transmitted to the node $LSN_0$.

Thereafter, at a point in time T12, the signal lines FITL and FITR go low. Therefore, the FETs N102 and N105 are turned off. Moreover, at the same time at which the signal line FB goes high, one signal out of the signal $A_{9R}$ and the signal $BA_{9R}$ which is on the side of the cell array to be refreshed goes high, and the transfer gate TG100 or TG101 is turned on.

In the aforementioned example, the cell array on the right side in the drawing is to be refreshed, whereby the signal $A_{9R}$ goes high. Therefore, an output of the AND circuit AN100 goes high and an output of NOR100 goes low, whereby the transfer gate TG100 is turned on. Accordingly, the negative voltage (–1.5 V, for example) is applied to the bit line $RBL_0$ and applied to the drain D of the memory cell MC selected by the word line WL. As a result, the "0" data is written into the memory cell MC and refreshed.

As can be seen from the above, in the refresh operation, the signal lines $CSL_0$ to $CSL_{511}$ and $WCSL_0$ to $WCSL_{511}$ do not rise, whereby write-back to the memory cells MC is performed on all of the memory cells MC whose word line RWL or LWR is high on the side of the cell array to be refreshed (all of the bit lines $RBL_0$ to $RBL_{1023}$ or $LBL_0$ to $LBL_{1023}$) during a period when the signal line FB is high.

Figure 5:
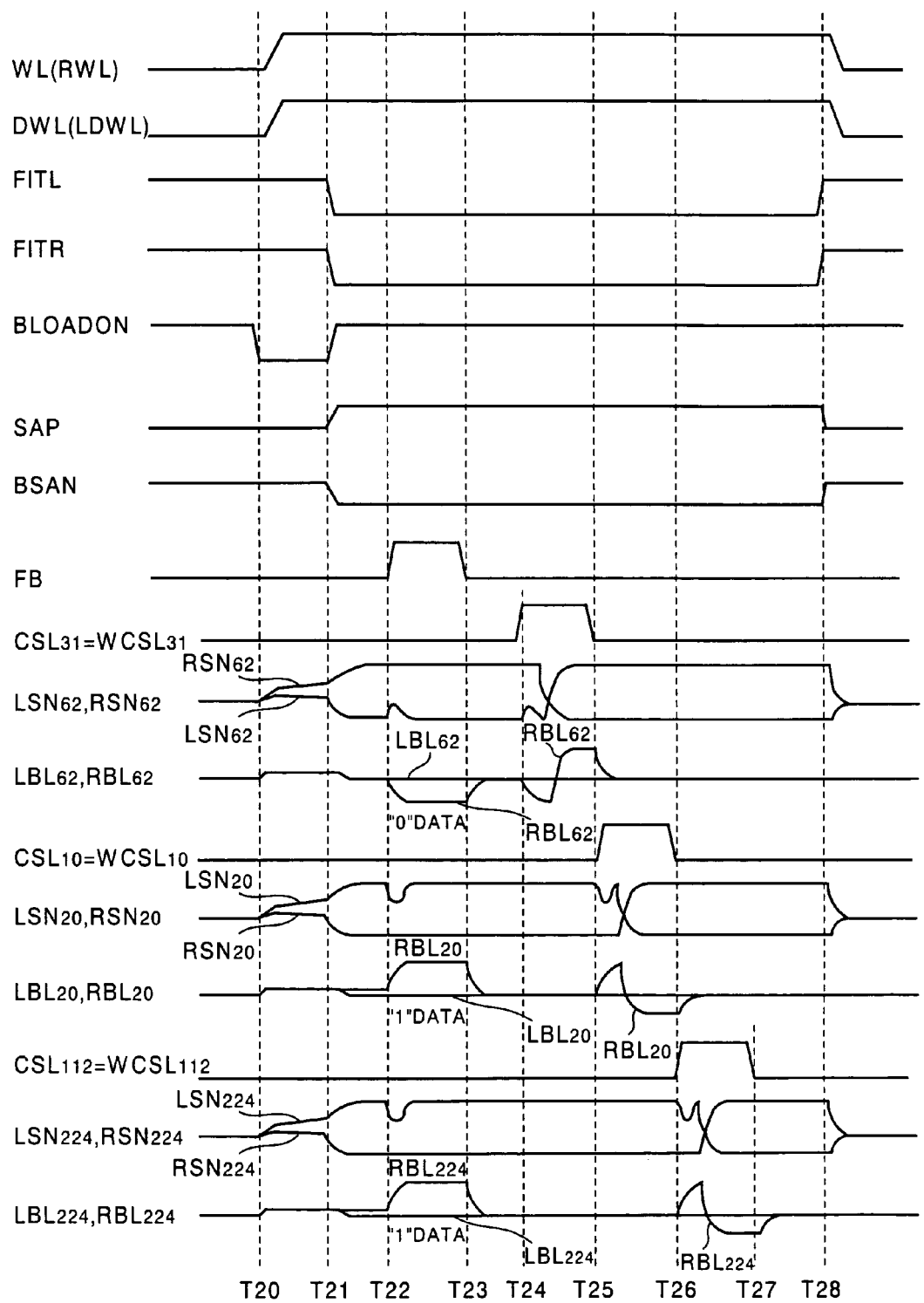
FIG. 5 is a timing chart explaining a continuous write operation of the semiconductor memory device according to the first embodiment.

FIG. 5 is a diagram showing operation waveforms when a continuous write operation is performed by switching the column address to select a column.

As can be seen from FIG. 5, the same operation as the aforementioned refresh operation is performed from a point in time T20 to a point in time T23. Namely, when a case where the continuous write operation is performed on the cell array on the right side of the sense amplifiers $S/A_0$ to $S/A_{1023}$ is assumed, one word line RWL on the right side of $S/A_0$ to $S/A_{1023}$ rises and one dummy word line LDWL on the left side of the sense amplifiers $S/A_0$ to $S/A_{1023}$ rises. Then, the signal line FB goes high, and the refresh operation is performed. As a result, holes which have disappeared due to a charge pumping phenomenon are made up.

Then, between a point in time T24 and a point in time T25, the 31st signal line $CSL_{31}$ and the 31st signal line $WCSL_{31}$ go high. Thereby, the FET N103 and the FET N104 of the sense amplifier $S/A_{62}$ are turned on. If data to be written is assumed here to be "1", the positive voltage (1.5 V, for example) is supplied to the data line DQ0 and the negative voltage (–1.5 V, for example) is supplied to the data line BDQ0. Hence, the node $LSN_{62}$ goes high and the node $RSN_{62}$ goes low.

Since the signal $A_{9R}$ is also high, an output of the NOR circuit 100 goes low, and the transfer gate TG100 of the sense amplifier $S/A_{62}$ is turned on. Consequently, the bit line $RBL_{62}$ goes high (1.5 V, for example), and the "1" data is written into the memory cell MC.

Incidentally, in this embodiment, the signal line $CSL_{31}$ and the signal line $WCSL_{31}$ for the sense amplifier $S/A_{62}$ is shared with the sense amplifier $S/A_{63}$. Therefore, data inputted from the data lines DQ1 and the BDQ1 is also written as it is into the memory cell MC connected to the bit line $RBL_{63}$.

Then, in the example in FIG. 5, between the point in time T25 and a point in time T26, the 10th signal line $CSL_{10}$ and the 10th signal line $WCSL_{10}$ go high, and the "0" data is written into the memory cell MC connected to the bit line $RBL_{20}$. Subsequently, between the point in time T26 and a point in time T27, the 112th signal line $CSL_{112}$ and the 112th signal line $WCSL_{112}$ go high, and the "0" data is written into the memory cell MC connected to the bit line $RBL_{224}$.

Finally, at a point in time T28, the word line RWL which has risen is driven low, the dummy word line LDWL which has also risen is driven low, and the continuous write operation on the memory cells MC connected to one word line RWL is completed.

As can be seen from FIG. 5, the signal of the signal line FB provided along the row direction rises only once between the point in time T 22 and the point in time T23, and thereafter it is deactivated. In the write operation, only the transfer gates TG100 and TG101 associated with the signal line WCSL which has risen are turned on, and data is written into the memory cells MC in sequence. In a column not selected, the signal line WCSL remains low, and the transfer gates TG100 and TG101 are off, whereby the bit lines LBL and RBL are in a floating state, and therefore no cell current flows, resulting in a reduction in current consumption.

Figure 6:
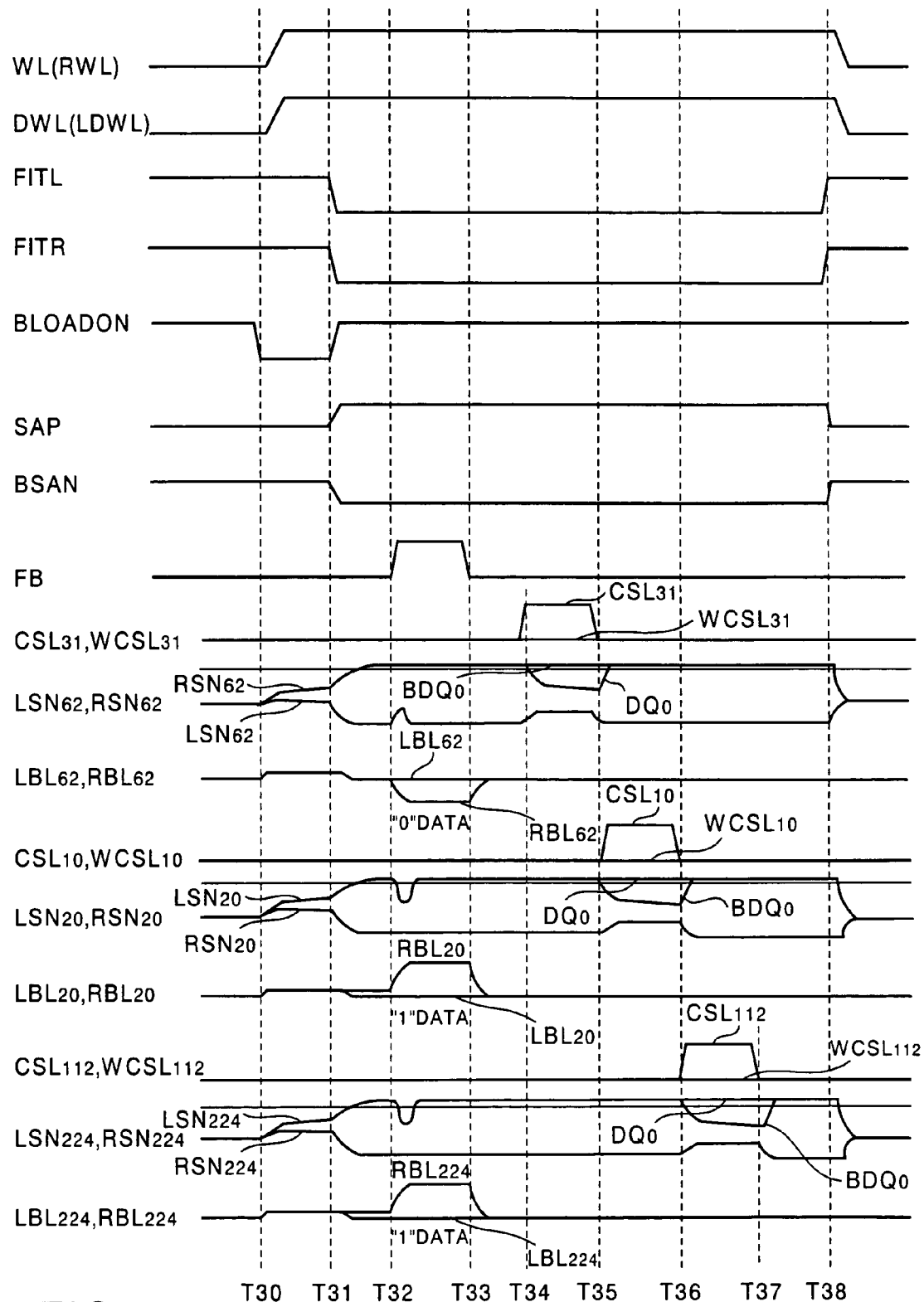
FIG. 6 is a timing chart explaining a continuous read operation of the semiconductor memory device according to the first embodiment.

FIG. 6 is a diagram showing operation waveforms when a continuous read operation is performed by switching the column address. As can be seen from FIG. 6, similarly to the aforementioned write operation, the refresh operation is performed between a point in time T30 and a point in time T33. In this refresh operation, data read from the memory cells MC are held in the sense amplifiers $S/A_0$ to $S/A_{1023}$, and the nodes $LSN_0$ to $LSN_{1023}$ and $RSN_0$ to $RSN_{1023}$ come to have voltages corresponding to the data.

If it is assumed here that data is read from the memory cell MC on the right side of the sense amplifiers $S/A_0$ to $S/A_{1023}$, when the memory cell MC holds the "0" data, the corresponding node RNS goes high and the corresponding node LSN goes low. When the memory cell MC holds the "1" data, the corresponding node RNS goes low, and the corresponding node LSN goes high.

Then, by driving the signal line $CSL_{31}$ high between a point in time T34 and a point in time T35, the FETs N103 and N104 are turned on, and data latched by the nodes $LSN_{62}$ and $RSN_{62}$ are read from the data line DQ0 and the data line BDQ0. More specifically, both the data lines DQ0 and BDQ0 are precharged high. Since the node $RNS_{62}$ is high, the data line BDQ0 remains high. Since the node $LSN_{62}$ is low, the voltage of the data line DQ0 drops from high level. By detecting these changes of the data lines DQ0 and BDQ0, the data in the memory cell MC is read. During this period, the signal line $WCSL_{31}$ remains low. Therefore, the transfer gates TG100 and TG101 are turned off, whereby the node $LSN_{62}$ is separated from the bit line $RBL_{62}$ and the node $RSN_{62}$ is separated from the bit line $LBL_{62}$.

Incidentally, in this embodiment, the signal line $CSL_{31}$ of the sense amplifier $S/A_{62}$ is shared with the sense amplifier $S/A_{63}$. Hence, data held in the sense amplifier $S/A_{63}$ is simultaneously read from the data lines DQ1 and BDQ1, but unnecessary data has only to be abandoned.

In the same manner as above, in the example in FIG. 6, next, between the point in time T35 and a point in time T36, data held in the nodes $LSN_{20}$ and $RSN_{20}$ of the sense amplifier $S/A_{20}$ are read by driving the signal line $CSL_{10}$ high. Subsequently, between the point in time T36 and a point in time T37, data held in the nodes $LSN_{224}$ and $RSN_{224}$ of the sense amplifier $S/A_{224}$ are read by driving the signal line $CSL_{112}$ high.

Finally, at a point in time T38, the word line RWL which has risen is driven low, the dummy word line LDWL which has also risen is driven low, and the continuous read operation on the memory cells MC connected to one word line RWL is completed.

Figure 7:
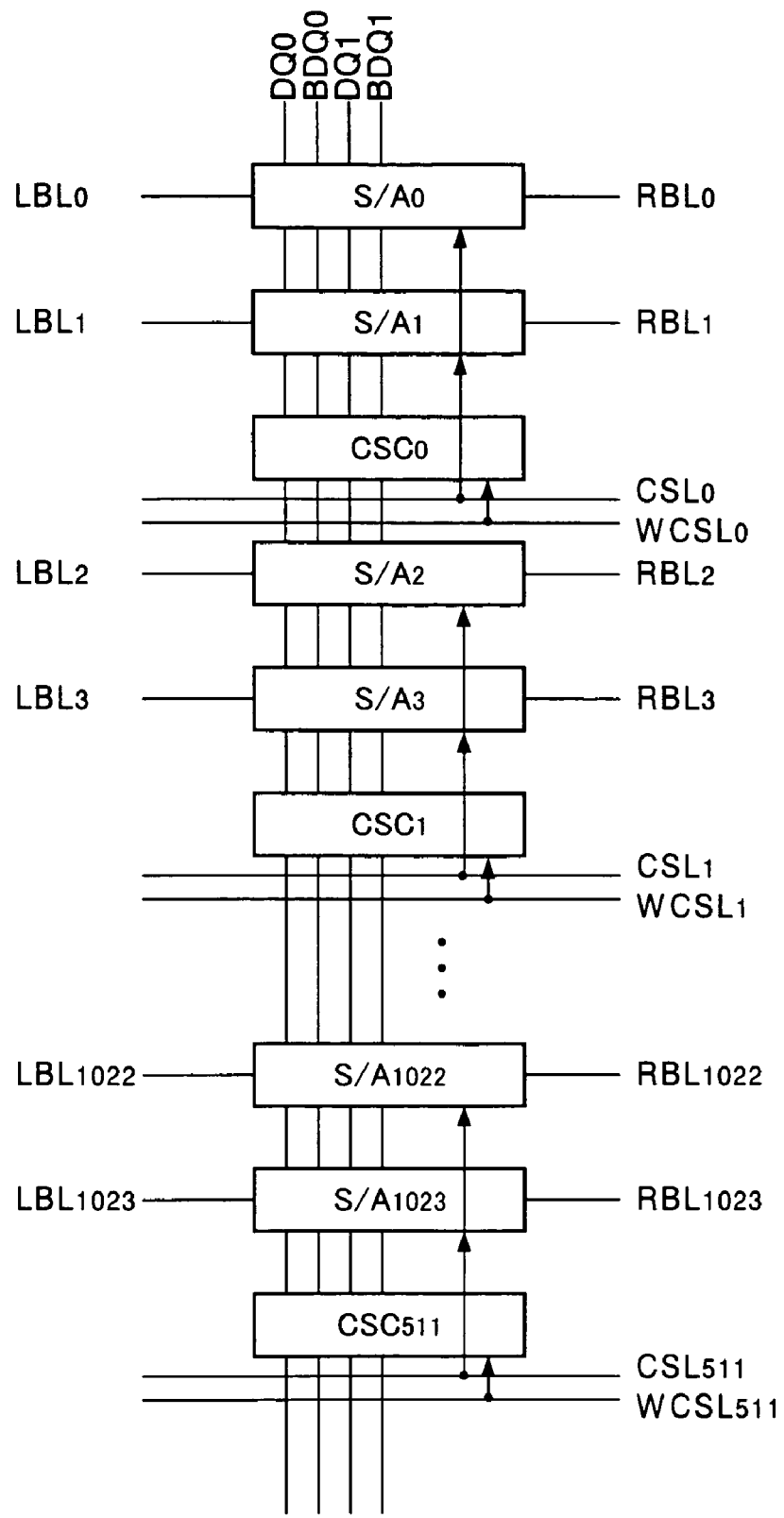
FIG. 7 is a diagram explaining the layout of the sense amplifiers and the column selection circuits in the semiconductor memory device according to the first embodiment.
Figure 8:
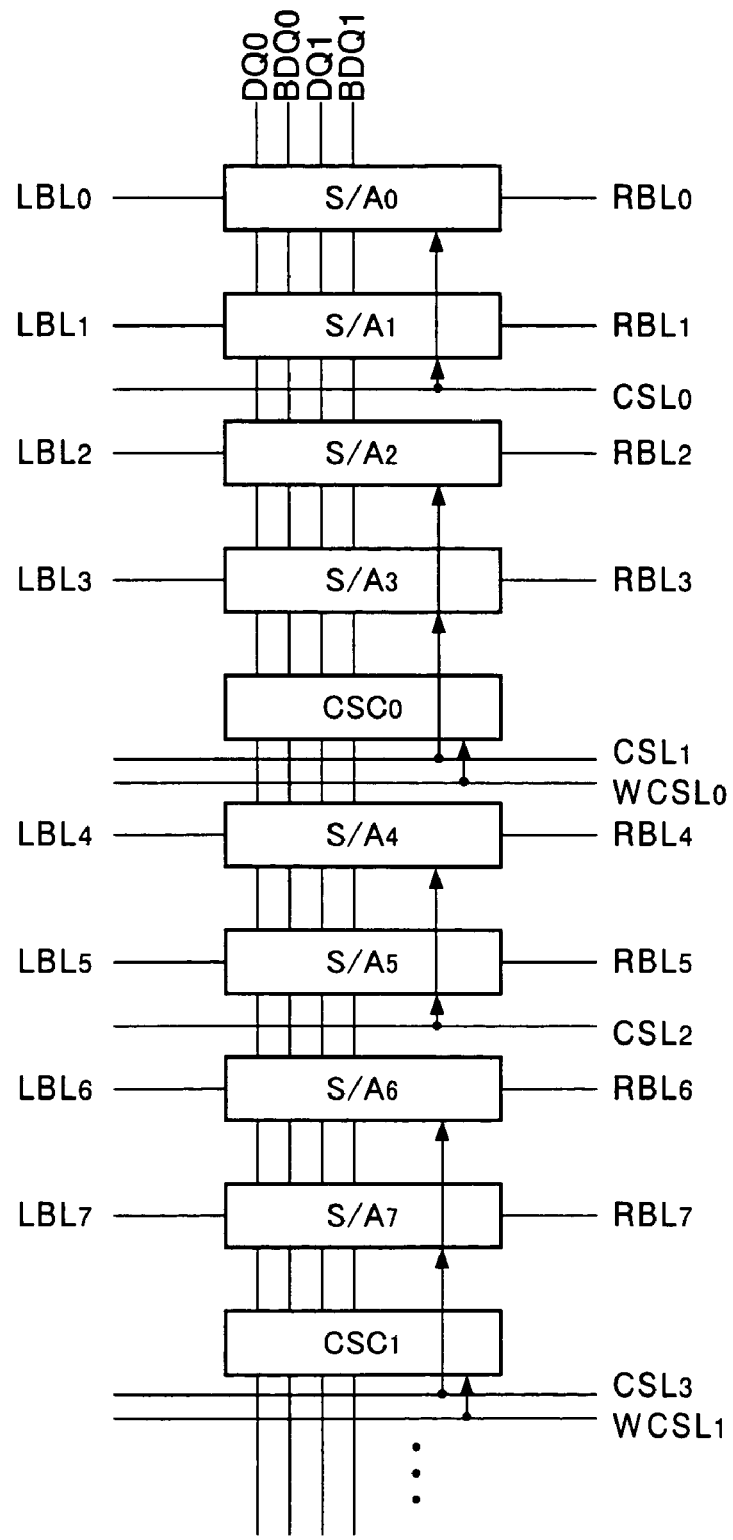
FIG. 8 is a diagram explaining a modification of the first embodiment.

Incidentally, in this embodiment, as shown in FIG. 7, an input unit of the signal lines $CSL_0$ to $CSL_{511}$ (signal lines which control the connection between the data lines DQ0, BDQ0, DQ1, and BDQ1 and the sense nodes RSN and LSN) and an input unit of the signal lines $WCSL_0$ to $WCSL_{511}$ (signal lines which control the connection between the bit lines RBL and LBL and the sense nodes RSN and LSN) are the same in that two sense amplifiers S/A are their controlled objects. But, the present invention is not limited to this aspect. For example, as shown in FIG. 8, it is possible that one signal line CSL is provided to control two sense amplifiers S/A and one signal line WCSL is provided to control four sense amplifiers S/A. In other words, it is possible to provide one signal line CSL for two pairs of bit lines and one signal line WCSL for four pairs of bit lines. Similarly, one signal line WCSL can be provided for 8 pairs, 16 pairs, . . . of bit lines.

In FIG. 8, in the continuous write operation, for example, when the sense amplifier to which the memory cell MC, into which data is written, is connected is $S/A_3$, not only the sense amplifier $S/A_3$ writes data of the data lines DQ1 and BDQ1 into the memory cell MC, but also the sense amplifiers $S/A_0$ to $S/A_2$ are activated and latched data is rewritten. Therefore, current consumption increases. But, since the number of column selection circuits CSC can be reduced, the chip area can be correspondingly reduced. In other words, the range which the signal line WCSL can control needs to be determined in consideration of a trade-off between chip area and current consumption.

Second Embodiment

In the aforementioned first embodiment, every time data to be written is held in the sense amplifier S/A, the data is written into the memory cell MC, but in the second embodiment, after all data to be written are held in the sense amplifiers $S/A_0$ to $S/A_{1023}$, data latched in the sense amplifier $S/A_0$ to $S/A_{1023}$ are written into the memory cells MC all at once.

Figure 9:
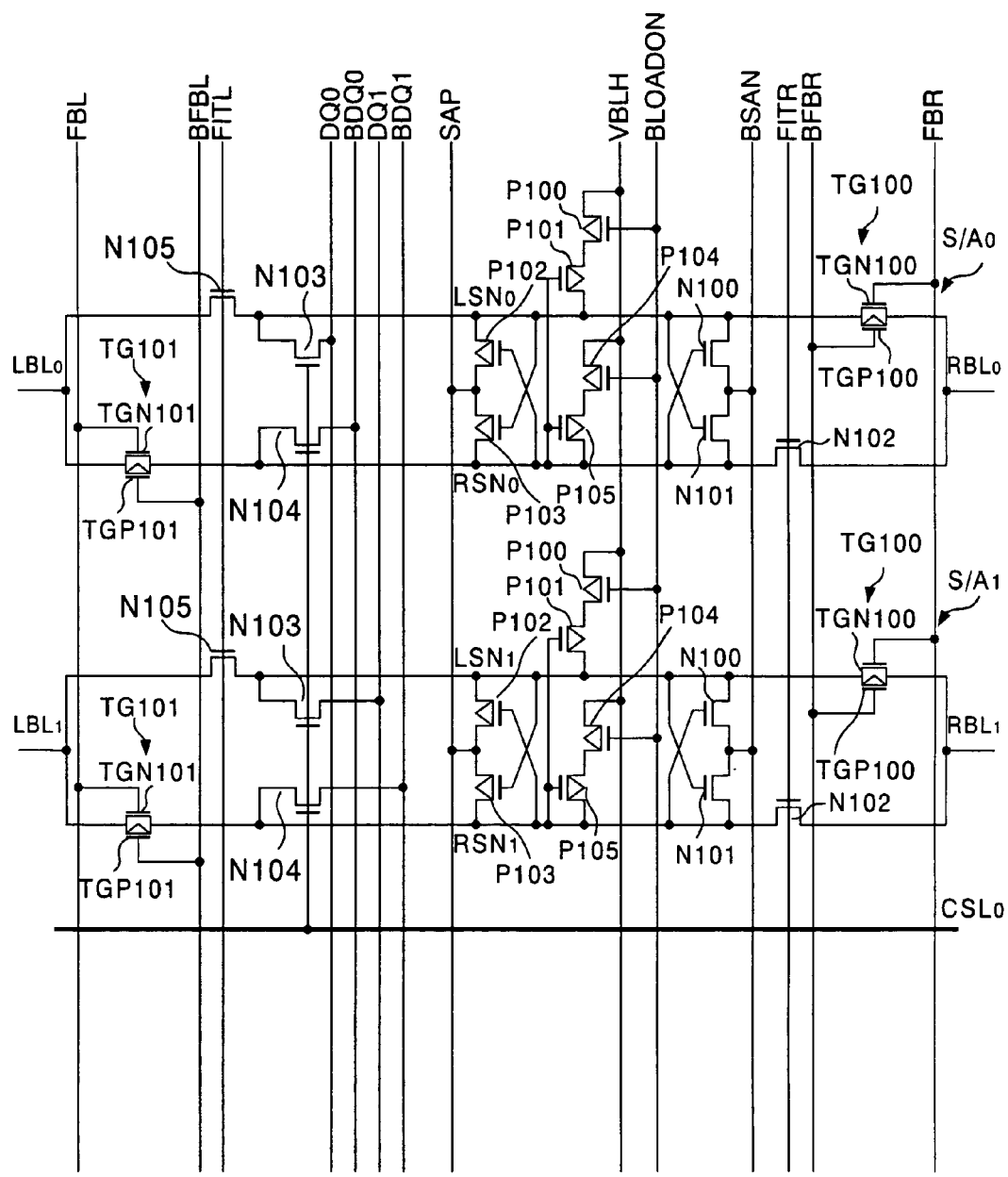
FIG. 9 is a diagram explaining the configuration of a sense amplifier according to a second embodiment.
Figure 10:
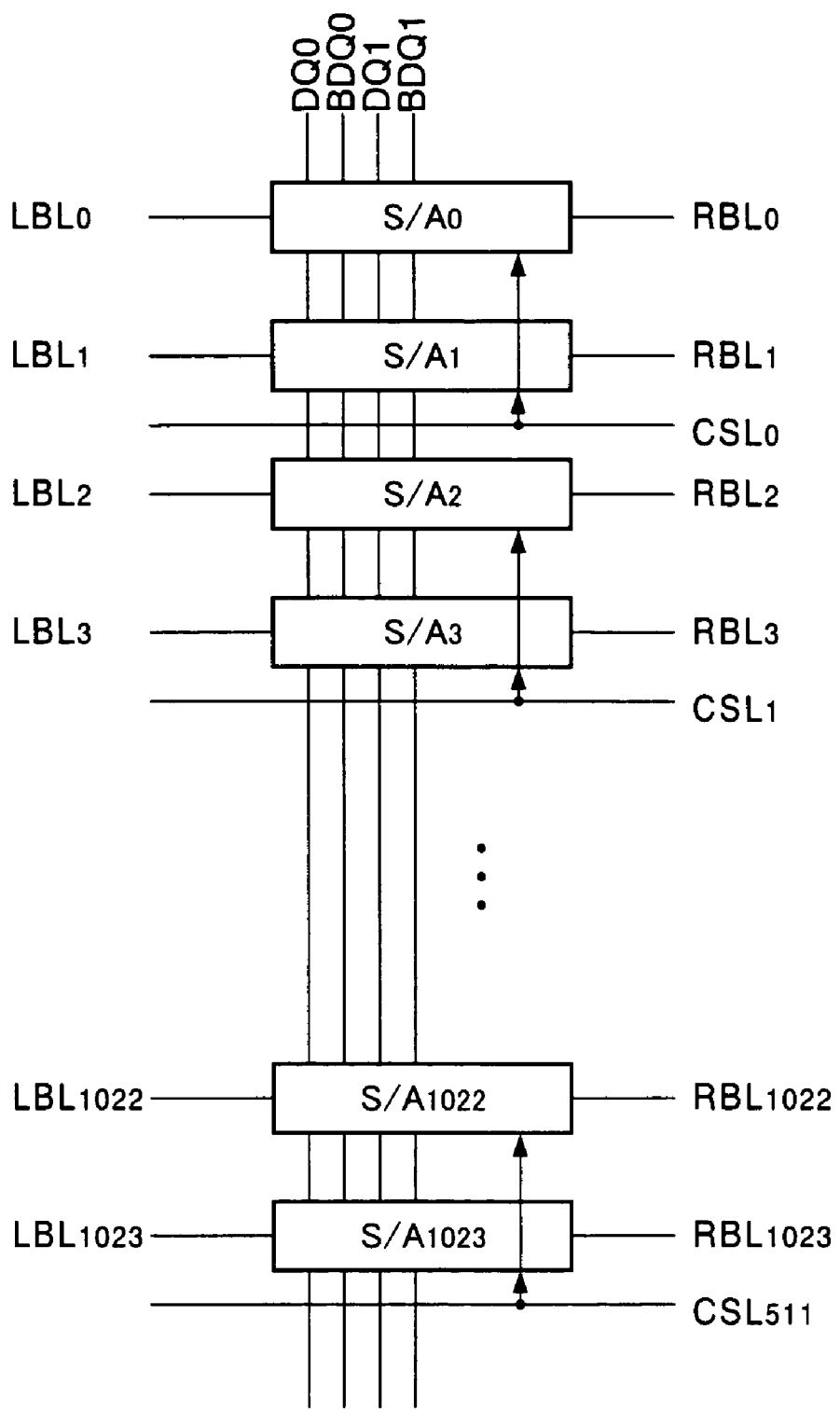
FIG. 10 is a diagram explaining the layout of the sense amplifiers according to the second embodiment.

FIG. 9 is a diagram showing an example of the configuration of the sense amplifiers $S/A_0$ and $S/A_1$, and FIG. 10 is a diagram showing the layout of the sense amplifiers $S/A_0$ to $S/A_{1023}$ and the signal lines $CSL_0$ to $CSL_{511}$. Incidentally, the placement of the word lines $RWL_0$ to $RWL_{255}$ and $LWL_0$ to $LWL_{255}$, the bit lines $RBL_0$ to $RBL_{1023}$ and $LBL_0$ to $LBL_{1023}$, the dummy word lines RDWL and LDWL, and the memory cells MC is the same as that in FIG. 2 described above.

As can be seen from these figures, the basic configuration of the sense amplifier S/A according to this embodiment is the same as that in the aforementioned first embodiment. However, the column selection circuit CSC is omitted, and a signal line FBR, a signal line BFBR, a signal line FBL, and a signal line BFBL are additionally provided.

The signal line FBR is connected to a gate of the N-type FET TGN100 in the transfer gate TG100, and the signal line BFBR is connected to a gate of the P-type FET TGP100 in the same transfer gate TG100. The signal line FBL is connected to a gate of the N-type FET TGN101 in the transfer gate TG101, and the signal line BFBL is connected to a gate of the P-type FET TGP101 in the same transfer gate TG101.

As can be seen from FIG. 10, in this embodiment, the signal lines $CSL_0$ to $CSL_{511}$ are each provided for two sense amplifiers S/A, and unlike the first embodiment, the column selection circuit CSC and the signal line WCSL are not provided.

A refresh operation in a semiconductor memory device according to this embodiment is the same as that in FIG. 4 in the first embodiment, and a continuous read operation is also the same as that in FIG. 6 in the first embodiment. However, a continuous write operation is different from that in the first embodiment.

FIG. 11 is a diagram showing an example of operation waveforms when a continuous write operation is performed by switching the column address to select a column. Here, a case where the continuous write operation is performed on memory cells on the right side of the sense amplifiers $S/A_0$ to $S/A_{1023}$ is assumed.

As shown in FIG. 11, between a point in time T40 and a point in time T43, a refresh operation to make up for holes which have disappeared due to the charge pumping phenomenon is performed as in the aforementioned first embodiment. However, this embodiment is different from the aforementioned first embodiment in that when data is written back to the memory cells MC, the transfer gate TG100 is turned on by driving the signal line FBR high and the signal line BRFR low in place of driving the signal line FB between a point in time T42 and the point in time T43.

Then, between a point in time T44 and a point in time T45, the 31st signal line $CSL_{31}$ goes high. Thereby, the FET N103 and the FET N104 of the sense amplifier $S/A_{62}$ are turned on. If data to be written is assumed here to be "1", the positive voltage (1.5 V, for example) is supplied to the data line DQ0 and the negative voltage (−1.5 V, for example) is supplied to the data line BDQ0. Hence, the node $LSN_{62}$ goes high and the node $RSN_{62}$ goes low. As a result, the "1" data is held in the sense amplifier $S/A_{62}$.

Incidentally, in this embodiment, the signal line $CSL_{31}$ for the sense amplifier $S/A_{62}$ is shared with the sense amplifier $S/A_{63}$. Therefore, the FETs N103 and N104 of the sense amplifier $S/A_{63}$ are also turned on, and hence write voltages of the data lines DQ1 and BDQ1 are simultaneously written into the sense amplifier S/A$_{63}$.

Then, in the example in FIG. 11, between the point in time T45 and a point in time T46, the 10th signal line CSL$_{10}$ goes high, and the "0" data is held in the sense amplifier S/A$_{20}$. Subsequently, between the point in time T46 and a point in time T47, the 112th signal line CSL$_{112}$ goes high, and the "0" data is held in the sense amplifier S/A$_{224}$.

Finally, between a point in time T48 and a point in time T49, the signal line FBR goes high and the signal line BRFR goes low, whereby the transfer gates TG100 are turned on. As a result, data held in the respective sense amplifiers S/A$_0$ to S/A$_{1023}$ are written into the respective memory cells MC all at once.

Incidentally, data of the data line DQ0, data of the data line BDQ0, data of the data line DQ1, data of the data line BDQ1, a signal of the signal line FBL, a signal of the signal line BFBL, a signal of the signal line FITL, a signal of the signal line BLOADON, a signal of the signal line FITR, a signal of the signal line BFBR, a signal of the signal line FBR, a voltage of the voltage supply line SAP, a voltage of the voltage supply line VBLH, and a voltage of the voltage supply line BSAN are supplied from the control circuit CTL shown in FIG. 2. A signal of the signal line CSL is supplied from the column decoder circuit not shown here.

Moreover, the signal lines FBL, BFBL, FBR, and BFBR constitute a first control signal line which controls on/off of the transfer gates TG100 and TG101 as a first switch circuit in this embodiment, and the signal line CSL constitutes a second control signal line which controls on/off of the FETs N103 and N104 as a second switch circuit in this embodiment.

As can be seen from FIG. 11, during the relatively long time required to hold data to be written into the respective sense amplifiers S/A$_0$ to S/A$_{1023}$, the bit lines RBL$_0$ to RBL$_{1023}$ and LBL$_0$ to LBL$_{1023}$ have 0 V, and no cell current flows. Therefore, the current consumption can be greatly reduced. During the period when data is written into the respective memory cells MC (between the point in time T48 and the point in time T49), the cell current flows through the respective bit lines RBL$_0$ to RBL$_{1023}$, but the period is short, which does not lead to a great increase in current consumption.

In this embodiment, the area of a sense amplifier region can be reduced as compared with the aforementioned first embodiment since the column selection circuit CSC is omitted. However, at the end of the continuous write operation, a write operation on each of the memory cells MC is performed all at once, whereby the cycle time in the row direction is lengthened. Further, since the write operation is performed on all the memory cells MC, the write operation is performed even on the memory cells MC which have not been actually rewritten, which results in an increase in current consumption. Furthermore, the write operation is performed on the memory cells MC connected to one word line WL all at once, whereby the peak of the current rises, and hence noise in a semiconductor chip possibly increases. Accordingly, it is recommended to determine whether to adopt the first embodiment or the second embodiment in consideration of boundary conditions imposed on actual products (Which is the most important, a reduction in chip size, a reduction in cycle in the row direction, or a significant reduction in noise?).

It should be mentioned that the present invention is not limited to the aforementioned embodiments, and various changes may be made therein. For example, the application of the present invention is not limited to the FBC memory, and the present invention is applicable to a semiconductor memory device having a memory cell through which a current (usually, DC current) is passed in a write operation. For example, it is applicable to an MRAM (magnetic Random Access Memory).

To make high-speed access in the column direction possible, even in the MRAM, it is necessary to amplify and hold data in memory cells along the word line in sense amplifiers. This is a concept of so-called sense amplifier cache. Access to a page which needs a row address input is relatively slow, but once the page is opened, access to data in the page can be made at high speed by only switching the column address.

In this case, if the sense amplifier and the memory cell remain connected while the page is open, the current continues flowing through the memory cell. Accordingly, the current consumption can be further reduced if a path between the memory cell and the sense amplifier is cut off after the page is opened and data is transferred to the sense amplifier.

In the read operation, this path may remain cut off, but in the write operation, there are two methods of thinking as well. Namely, one is a method in which similarly to the first embodiment, at each write cycle, a path between a sense amplifier and a memory cell corresponding to each other is opened, and data is written into the memory cell. The other is a method in which similarly to the second embodiment, in a continuous write operation, data held in sense amplifiers are only rewritten, and after a continuous write cycle is completed, all paths between the sense amplifiers and memory cells are opened, and data is written into the memory cells.

Moreover, the aforementioned FET and transfer gate are examples of the switch circuit, and switch circuits with other configurations can also be used.

What is claimed is:

1. A semiconductor memory device, comprising:
    a memory cell array in which memory cells are arranged in a matrix form, data being written into each of the memory cells by passing a cell current therethrough;
    word lines which are provided in parallel along a row direction in the memory cell array;
    bit lines which are provided in parallel along a column direction in the memory cell array, the column direction being crossed with the row direction;
    sense amplifiers which are respectively connected to the bit lines and which write data held in the sense amplifiers into the memory cells;
    a data line which supplies data to be written into the sense amplifiers; and
    a control circuit which, in a continuous write operation by continuously switching a column address to select a column, opens only a connection between the sense amplifier selected by the column address and the bit line to write the data held in the sense amplifier into the memory cell.

2. The semiconductor memory device according to claim 1, wherein each of the sense amplifiers includes a first switch circuit which turns on/off a connection with the bit line and a second switch circuit which turns on/off a connection with the data line.

3. The semiconductor memory device according to claim 2, wherein, in the continuous write operation, the control circuit writes data into the sense amplifier and simultaneously turns on the first switch circuit of the sense amplifier.

4. The semiconductor memory device according to claim 3, further comprising:
   first control signal lines which are provided along the column direction and which supply a first control signal controlling the on/off of the second switch circuits;
   a second control signal line which is provided along the row direction and which supplies a second control signal;
   third control signal lines which are provided along the column direction and which supply a third control signal intended for at least the sense amplifiers including second switch circuits of which on/off are controlled by one of the first control signal lines but not intended for all of the sense amplifiers; and
   column selection circuits which generate a fourth control signal controlling the on/off of the first switch circuits based on the second control signal and the third control signal.

5. The semiconductor memory device according to claim 4, wherein the third control signal is activated when the data held in the sense amplifier is written into the memory cell.

6. The semiconductor memory device according to claim 1, wherein each of the memory cells comprises a MISFET which includes a gate connected to the word line, a drain connected to the bit line, and a source connected to a source line, a body between the drain and the source being in an electrically floating state.

7. The semiconductor memory device according to claim 1, wherein the cell current is a DC current.

8. A semiconductor memory device, comprising:
   a memory cell array in which memory cells are arranged in a matrix form, data being written into each of the memory cells by passing a cell current therethrough;
   word lines which are provided in parallel along a row direction in the memory cell array;
   bit lines which are provided in parallel along a column direction in the memory cell array, the column direction being crossed with the row direction;
   sense amplifiers which are respectively connected to the bit lines and which write data held in the sense amplifiers into the memory cells;
   a data line which supplies data to be written to the sense amplifiers; and
   a control circuit which, in a continuous write operation by continuously switching a column address to select a column, after cutting off connections between the sense amplifiers and the bit lines and continuously switching the column address such that each of the sense amplifiers holds the data to be written, opens the connections between the sense amplifiers and the bit lines and writes the data held in the sense amplifiers into the memory cells at once.

9. The semiconductor memory device according to claim 8, wherein each of the sense amplifiers includes a first switch circuit which turns on/off a connection with the bit line and a second switch circuit which turns on/off a connection with the data line.

10. The semiconductor memory device according to claim 9, further comprising:
    first control signal lines which supply a first control signal controlling the on/off of the first switch circuit; and
    second control signal lines which supply a second control signal controlling the on/off of the second switch circuits.

11. The semiconductor memory device according to claim 10, wherein, in the continuous write operation, the control circuit turns off the first switch circuit by the first control signal while the control circuit causes each of the sense amplifiers to hold the data in the data line by continuously switching the column address and turning on the second switch circuit by the second control signal.

12. The semiconductor memory device according to claim 11, wherein in the continuous write operation, the control circuit turns on the first switch circuits of all the sense amplifiers by the first control signal after the data is held in each of the sense amplifiers by continuously switching the column address.

13. The semiconductor memory device according to claim 8, wherein each of the memory cells comprises a MISFET which includes a gate connected to the word line, a drain connected to the bit line, and a source connected to a source line, a body between the drain and the source being in an electrically floating state.

14. The semiconductor memory device according to claim 8, wherein the cell current is a DC current.

* * * * *